US007064280B1

(12) United States Patent
Rodgers

(10) Patent No.: US 7,064,280 B1
(45) Date of Patent: Jun. 20, 2006

(54) RADIATION SHIELDING PANEL CONSTRUCTION SYSTEM AND PANELS THEREFORE

(76) Inventor: Jimmie A. Rodgers, 3530 Lowlen Ct., Ellicott City, MD (US) 21042

( * ) Notice: Subject to any disclaimer, the term of this patent is extended or adjusted under 35 U.S.C. 154(b) by 0 days.

(21) Appl. No.: 11/229,590

(22) Filed: Sep. 20, 2005

(51) Int. Cl.
 *H05K 9/00* (2006.01)
(52) U.S. Cl. ............ 174/384; 174/350; 174/377; 174/386; 174/394
(58) Field of Classification Search ........... 174/35 R, 174/35 MS, 350, 351, 363, 372, 377, 384, 174/386, 394; 361/800, 816, 818
See application file for complete search history.

(56) References Cited

U.S. PATENT DOCUMENTS

| | | | |
|---|---|---|---|
| 1,815,921 A | 7/1931 | Lapof | |
| 1,815,922 A | 7/1931 | Lapof | |
| 2,961,478 A * | 11/1960 | Burns | 174/35 MS |
| 3,229,270 A | 1/1966 | Rosenblatt | |
| 3,230,375 A | 1/1966 | Van Wagoner et al. | |
| 3,231,451 A | 1/1966 | Gazelle | |
| 3,432,609 A * | 3/1969 | Brion, Jr. et al. | 174/35 MS |
| 3,517,627 A | 6/1970 | Kruse | |
| 4,038,553 A | 7/1977 | McCullgh | |
| 4,074,141 A | 2/1978 | Bryant | |
| 4,514,270 A | 4/1985 | Furutani et al. | |
| 4,567,100 A | 1/1986 | Pickett et al. | |
| 4,608,453 A * | 8/1986 | Freeman | 174/35 MS |
| 4,749,625 A * | 6/1988 | Obayashi et al. | 174/35 MS |
| 4,774,148 A * | 9/1988 | Goto | 428/607 |
| 4,806,703 A * | 2/1989 | Sims | 174/35 MS |
| 4,823,523 A | 4/1989 | Coupard et al. | |
| 4,959,504 A * | 9/1990 | Yarger et al. | 174/35 MS |
| 4,965,408 A * | 10/1990 | Chapman et al. | 174/35 MS |
| 5,244,708 A * | 9/1993 | Tsuchida et al. | 174/35 MS |
| 5,262,588 A * | 11/1993 | Gallagher | 174/35 R |
| 5,286,318 A * | 2/1994 | Sims et al. | 174/35 MS |
| 5,534,663 A * | 7/1996 | Rivers et al. | 174/35 GC |
| 5,545,844 A * | 8/1996 | Plummer et al. | 174/35 MS |
| 5,548,085 A * | 8/1996 | Flores | 174/35 R |
| 6,720,494 B1 * | 4/2004 | Norte et al. | 174/35 GC |
| 6,884,936 B1 * | 4/2005 | Takahashi et al. | 174/35 MS |

* cited by examiner

*Primary Examiner*—Dean A. Reichard
*Assistant Examiner*—Adolfo Nino
(74) *Attorney, Agent, or Firm*—Rosenberg, Klein & Lee

(57) ABSTRACT

A construction system for shielding a room includes a plurality of inter-fitting panels (100, 100') adapted for mounting to structural surfaces (10, 12, 14, 16) of a room. Each of the panels has at least two layers (120, 130) of lead that are offset one with respect to the other in two directions to define a recessed lip (102, 104) on two adjacent sides of the panel and an overhanging lip (106, 108) on the remaining two sides of the panel.

17 Claims, 4 Drawing Sheets

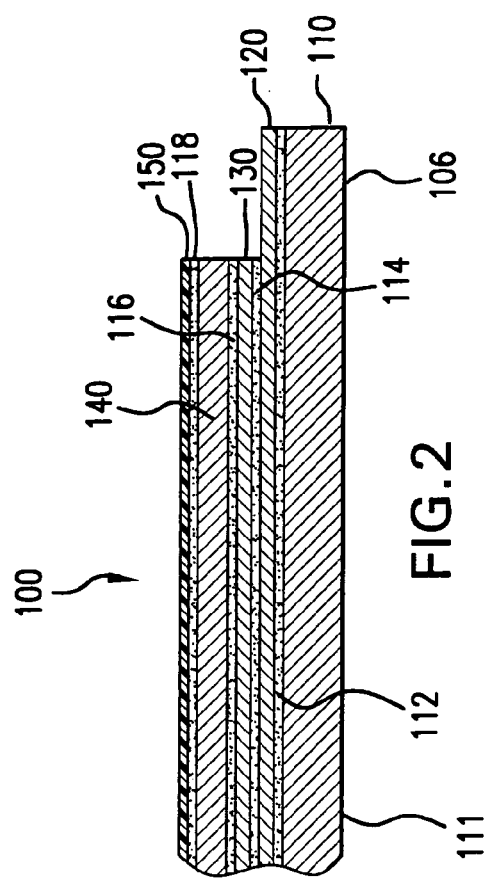
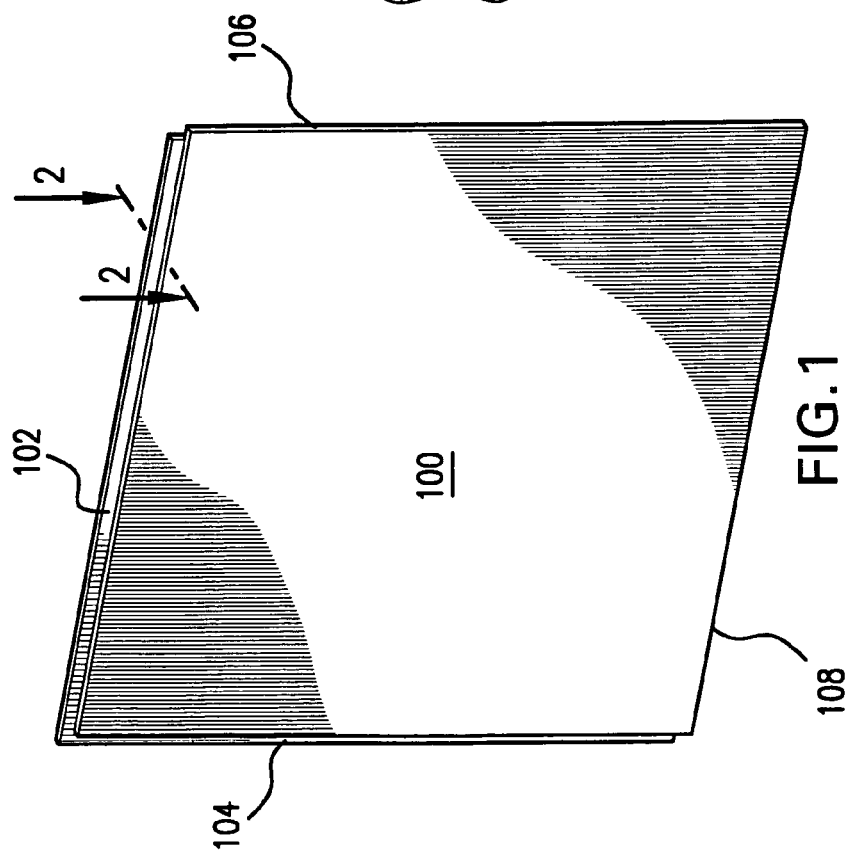

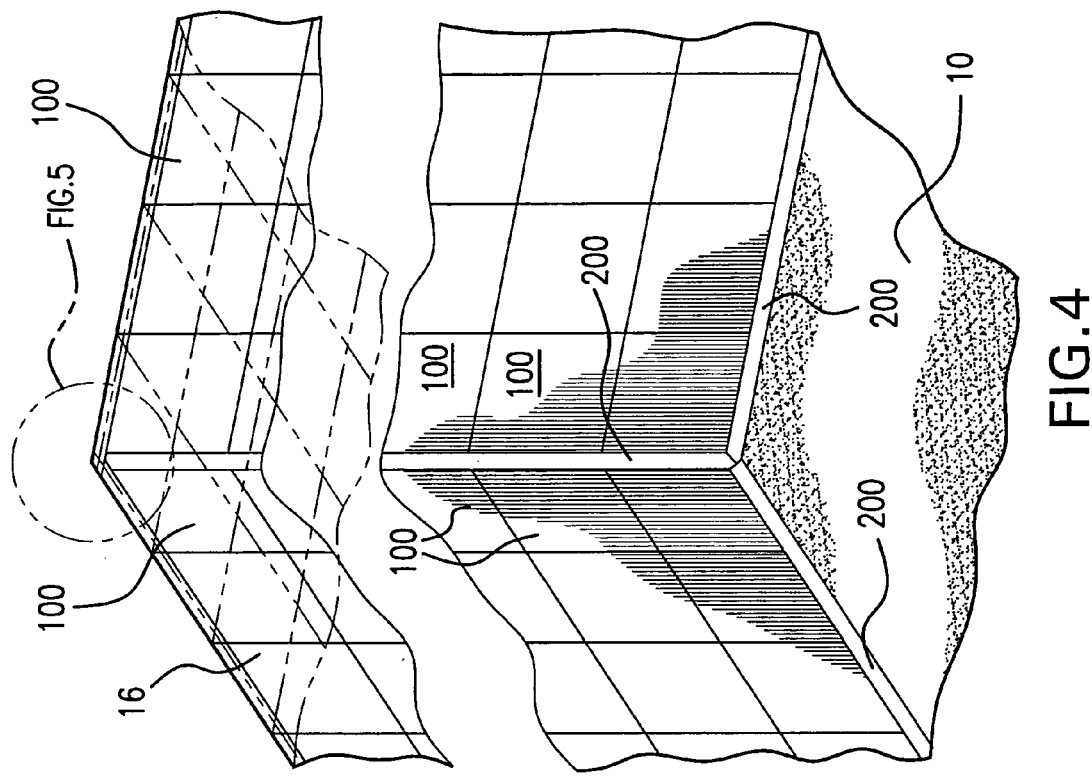
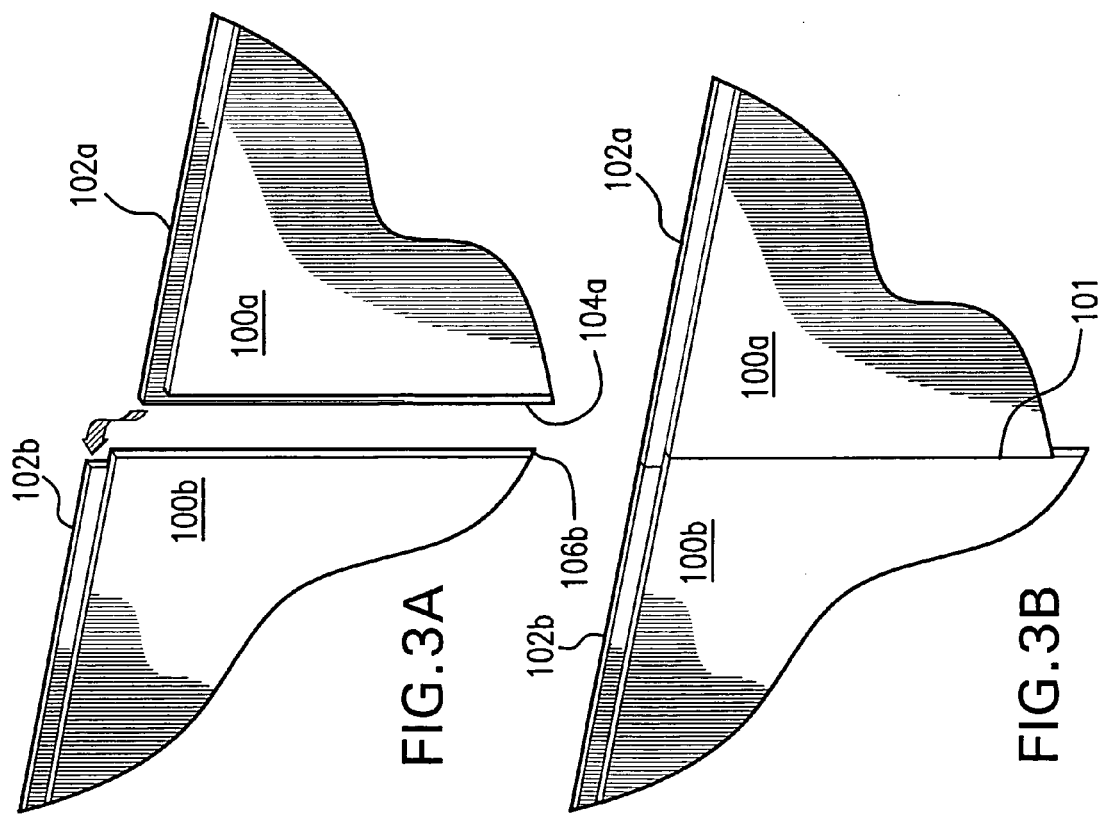

US 7,064,280 B1

RADIATION SHIELDING PANEL CONSTRUCTION SYSTEM AND PANELS THEREFORE

BACKGROUND OF THE INVENTION

1. Field of the Invention

This invention directs itself to panels for use in assembling a radiation shielded space within a building. In particular, this invention directs itself to a modular scheme of inter-fitting panels wherein each panel has at least two layers formed of lead that are offset one with respect to the other in two directions to define a recessed lip on two adjacent sides of the panel and an overhanging lip on a remaining two adjacent sides of the panel. Still further, this invention directs itself to the construction system for adding radiation shielding to a room wherein a plurality of corner strips are provided for overlaying adjacent orthogonally disposed recessed or overhanging lips of a multiplicity of the plurality of inter-fitting panels at an intersection of a pair of structural surfaces of a room. Still further, the invention pertains to a method for adding radiation shielding to a room that includes providing a plurality of inter-fitting panels, where each of the panels has at least two lead layers that are offset one from the other in two directions to form a pair of recessed lips on two adjacent sides of the panel and a pair of overhanging lips on a remaining two adjacent sides of the panel. The method further includes mounting the plurality of inter-fitting panels to structural surfaces of the room, wherein the overhanging lips of one panel overlay respective recess lips of a pair of adjacent panels.

2. Prior Art

Radiation shielding for use within a building is well known in the art. Typically, such systems are incorporated into the building structure during its initial construction, or retrofitted by demolishing existing interior structural surfaces and refitting the space with shielding materials and new structural surfaces. However, none of the prior art systems known to be available provide for a modular construction system wherein a plurality of panels which include a radiation shielding material, such as lead, are provided for securement to the structural surfaces existing in a room. None of the prior art methods of providing radiation shielding disclose the use of inter-fitting panels which are adhesively secured to the structural surfaces of a building by means of pressure sensitive adhesive, or a hook and loop fastening system.

Until recently, radiation shielding was used almost exclusively for commercial applications in medical and research fields. With the increasing threat of terrorism in urban areas where use of a radiological disbursal device ("dirty bomb") is predicted by experts, individuals who live in such areas feel the need to protect themselves from radiation exposure in their homes. There is therefore a need for materials, not now available, to retrofit an interior space of a building to provide radiation shielding therefore.

SUMMARY OF THE INVENTION

A panel for use in assembling a radiation shielded space within a building is provided. The panel includes a laminated structure of a plurality of layers each having a rectangular contour. At least two of the layers are formed of lead and are offset one with respect to the other in two directions to define a recessed lip on two adjacent sides of the panel and an overhanging lip on a remaining two sides of the panel.

From another aspect, a construction system is provided for adding radiation shielding to a room. The system includes a plurality of inter-fitting panels adapted for mounting to structural surfaces of the room. Each of the panels has at least two lead layers being offset one from the other in two directions to form a recessed lip on two adjacent sides of the panel and an overhanging lip on a remaining two adjacent sides of the panel.

From yet another aspect, a method is provided for adding radiation shielding to a room. The method includes the step of providing a plurality of inter-fitting panels. Each of the panels has at least two lead layers that are offset one from the other in two directions to form a pair of recessed lips on two adjacent sides of the panel and a pair of overhanging lips on a remaining two adjacent sides of the panel. The method also includes the step of mounting the plurality of inter-fitting panels to structural surfaces of the room. The overhanging lips of one panel overlay respective recess lips of a pair of adjacent panels.

BRIEF DESCRIPTION OF THE DRAWINGS

FIG. 1 is a perspective view of a panel of the present invention;

FIG. 2 is a cross-sectional view of the panel of the present invention taken along the section line 2—2 of FIG. 1;

FIG. 3A and FIG. 3B are cut-away illustrations showing the panels of the present invention being inter-fit;

FIG. 4 is an illustration of the construction system of the present invention;

DESCRIPTION OF THE PREFERRED EMBODIMENTS

Figure 5:
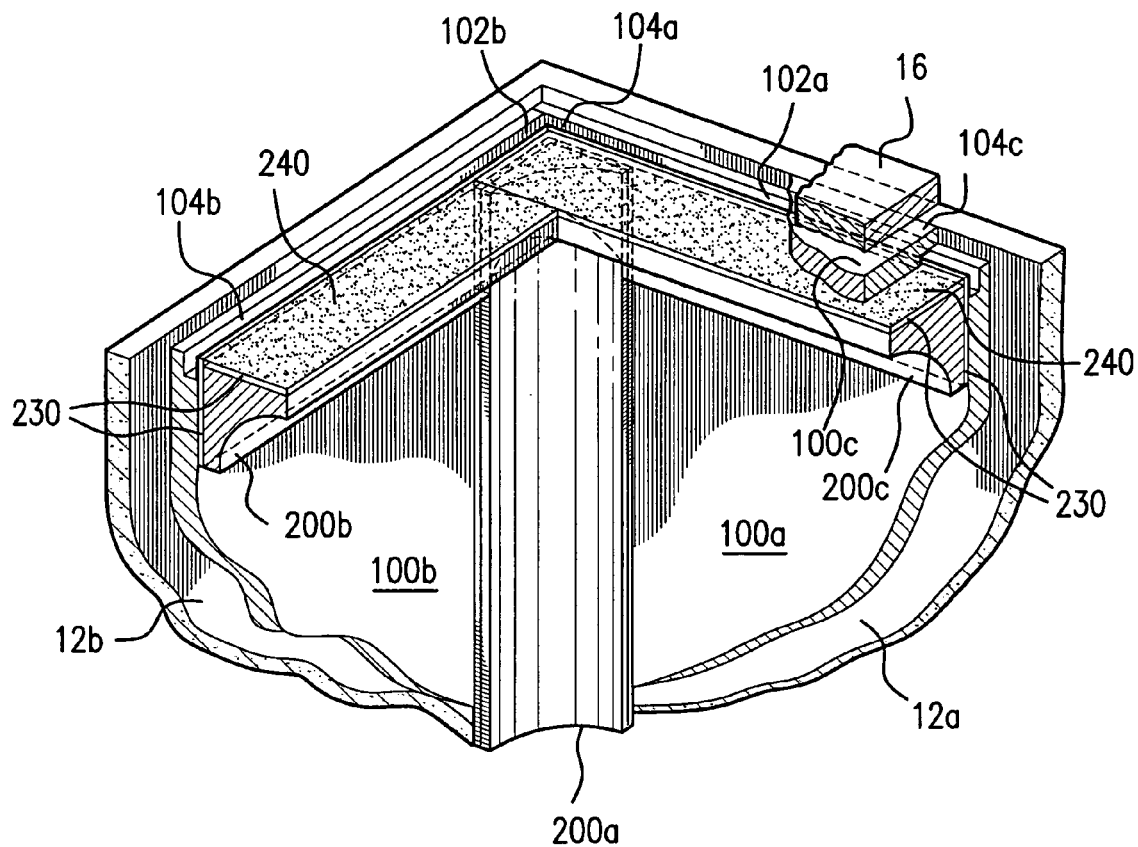
FIG. 5 is an enlarged portion of the intersection of a pair of walls and ceiling in a room employing the present invention depicted in FIG. 4.

Referring now to FIGS. 1–9, there is shown a construction system for adding radiation shielding to a room. The construction system makes use of a plurality of radiation shielding panels 100 which may be mounted to one or more of the structural surfaces 10, 12, 14, 16 of a room within a building. Although not restricted to residential utilization, radiation shielding panels 100 are particularly adapted for the use in adding radiation shielding to a space within homes, condominiums and apartments located in urban areas that may be at risk to radioactive contamination from a radiological disbursal device. Additionally, radiation shielding panels 100 provides an aesthetically pleasing appearance suitable for commercial applications such as physician and dental offices, medical laboratories and hospitals where x-ray and/or radiological treatments are carried out.

Referring now more particularly to FIGS. 1 and 2, there is shown radiation shielding panel 100 for use in assembling a radiation shielded space within a building. Radiation panel 100 includes a pair of recessed lips 102 and 104 disposed on adjacent sides of panel 100, and are integrally joined together. Further, panel 100 includes a pair of overhanging lips 106 and 108 on the two remaining adjacent sides of panel 100 that are integrally formed. Panel 100 is a laminated structure formed by a plurality of layers of different materials for providing the structural integrity of the panel, attenuation of radiation, securement to structural surfaces of the building, and an aesthetically pleasing appearance.

Panel 100 includes a front panel 110 having an outer surface 111, which itself may be aesthetically pleasing, or to which an overlaying, aesthetically pleasing material is applied. Front panel 110 may be formed of wood, metal, plastic or a composite material, not important to the inventive concepts disclosed herein. It is only important that front panel 110 provide structural rigidity and support for the first lead layer 120 bonded thereto. First lead layer 120 is bonded to front panel 110 by an adhesive layer 112. Adhesive layer 112 may be a polyimide, phenolic, polyurethane, epoxy, or acrylic (which includes cyanoacrylates), adhesive composition. First lead layer 120 is formed by metallic lead, which may be a foil or sheet of metallic lead. Although there are other materials which are more dense than lead that may be used as an alternative to first and second lead layers 120 and 130, at this time, lead is the most readily available, lowest cost and easily manufacturable material for use as a radiation shielding material.

The second lead layer 130 is bonded to the first lead layer 120 by means of an adhesive layer 114. Adhesive layer 114 may be any of a polyimide, phenolic, polyurethane, epoxy, acrylic or silicone adhesive composition suitable for metal to metal bonding. Second lead layer 130 is offset with respect to first lead layer 120 in two directions, thereby forming the recessed lips 102 and 104 on two adjacent sides of panel 100. Likewise, an overhanging lip 106 and 108 are respectively formed on two other adjacent sides of panel 100. The lips 102, 104, 106 and 108 are all of substantially equal size. By that arrangement, panels are joined by positioning the overhanging lips 106 and 108 of one panel 100 to overlay the corresponding recessed lips 102, 104 of adjacent panels, as illustrated with respect to two panels in FIGS. 3A and 3B. The inter-fitting structure of panels 100 provides the same overall thickness of lead at the joints 101 between the panels 100 as provided by the body of each panel 100.

A rear panel 140 is bonded to the rear side of the second lead layer 130 by an adhesive layer 116. Adhesive layer 116 may be any of a polyimide, phenolic, polyurethane, epoxy or acrylic adhesive composition, like that used to bond front panel 110 to the lead layer 120. Rear panel 140 provides structural integrity for panel 100 and support for the second lead layer 130. Rear panel 140 may be formed of wood, metal, plastic or a composite composition, not important to the inventive concepts as herein developed. The rear side of the rear panel 140 has an adhesive layer 118 thereon which is used to mount the panel 100 to a structural surface of a room, such as the walls or ceiling. Adhesive layer 118 may cover the entire rear surface of rear panel 140 or be in the form of stripes of adhesive, and is preferably a pressure sensitive adhesive overlaid by a release film 150 that is removed prior to securement of panel 100 to the structural surface of the room. One such pressure sensitive adhesive which has been found suitable for the weight of panels 100 is a product having the trade name QUICK-TILE available from Denso North America, Inc. of Houston, Tex.

Panel 100 may be manufactured in various sizes and although any of a variety of polygonal contours may be utilized for panel 100, it is believed that a rectangular contour is the most practical for use in retrofitting a room into a radiation shielded enclosure. Panel 100 may be formed in sizes such as 1'×1' foot, 2'×2', 2'×4', up to 4'×8' feet. Although larger sizes could be manufactured, the weight would make handling difficult, and substantially impractical. The thickness of the front panel 110 will vary as a function of the material from which it is manufactured. The thickness of front panel 110 will be in the range of 1/16 of an inch to 1/4 of an inch and will typically have a thickness of approximately 1/8 of an inch. Likewise, the rear panel 140 will have a thickness which is in the range of 1/32 of an inch to 1/8 of an inch, depending upon the material from which it is manufactured, and typically will be approximately 1/16 of an inch. The thickness of each of the metallic lead layers 120 and 130 will depend on the level of radiation protection which is to be provided. Each of the metallic lead layers 120, 130 may have a thickness in the range of 1/64 of an inch to 1/8 of an inch.

For most applications, lead layers 120 and 130 having a thickness of 1/32 of an inch, provide a combined thickness of 1/16 of an inch, which for walls, floors and ceilings provides sufficient radiation shielding to be adequate for use in hospitals and other medical facilities to provide shielding of secondary radiation in high workload environments, and shielding from primary radiological beams in moderate workload environments. That shielding level is generally considered more than sufficient for residential use to provide protection from radiation resulting from radiological dispersion devices. Further, utilizing metallic lead layers 120 and 130 each having a thickness of 1/32 of an inch, provides for a panel weight for the lead layers of 4 pounds per square foot, which is easily handled and well within the capacity of the adhesives utilized to laminate panel 100 and secure the panels 100 to the structural surfaces of a building.

Referring to FIGS. 3A, 3B and 4, the construction system of the instant invention is shown. As previously discussed, the individual panels 100 are arranged so that the overhanging lip 106b of a panel 100b overlays the recessed lip 104a of an adjacent panel 100a. By that arrangement, the second lead layer of the recessed lip 104a of the panel 100a is overlaid by the first lead layer of the overhanging lip 106B of the panel 10b. Thus, the overall lead thickness of each panel, defined by the thickness of the first and second lead layers 120 and 130, is maintained at the seams 101 between the panels, by virtue of the inter-fitting of the recessed and overhanging lips. Thus, each of the entire structural surfaces overlaid by the panels 100, as shown in FIG. 4, will provide a uniform thickness of lead throughout the entire surface.

However, at the interfaces between orthogonal structural surfaces, only a single layer of lead is provided by the panels, as one of the recessed or overhanging lips of each panel extends to the interface between the orthogonal structural surfaces. To overcome this problem of reduced shielding at the interface between adjacent orthogonal walls, between walls and ceiling, and between walls and flooring, the construction system includes corner strips 200 which provide an additional layer of metallic lead so that a uniform shielding is provided for the room. The corner strips 200 are installed like conventional molding to overlay panels at intersecting walls, at the intersection of walls and a floor surface 10 or panels overlaying a floor surface, and at the intersection of walls a ceiling material 16.

Figure 6:
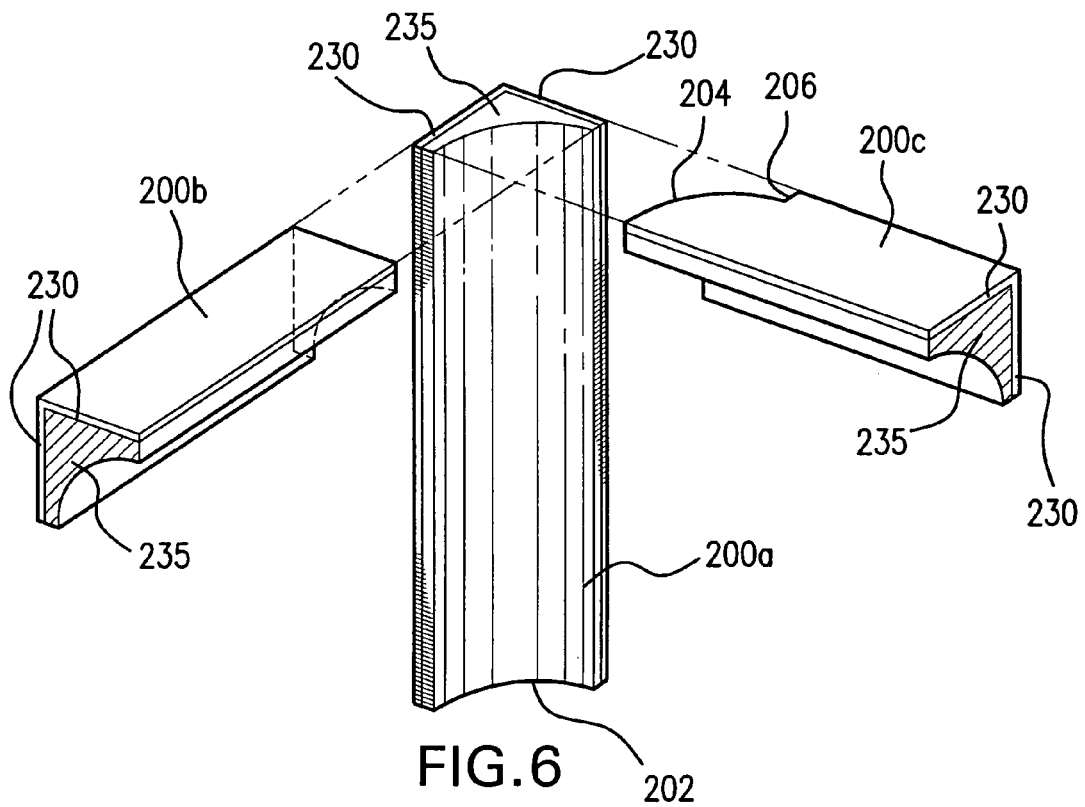
FIG. 6 is an exploded view of the corner strips of the present invention.

Referring now to FIGS. 5 and 6, the structure of the corner strips 200 is shown. The corner strips 200 are positioned to overlay the radiation shielding panels 100 at the intersection of orthogonal supporting surfaces, walls, ceilings, and in some cases, floors. Thus, the corner strip 200a extends vertically from floor to ceiling panels at the intersection of the orthogonally disposed panels 100a and 100b, which overlay the orthogonal support surfaces 12*a* and 12*b*, respectively. The support surfaces 12*a* and 12*b* are building walls which may be formed of concrete, drywall, plywood, oriented strand board materials, or the like. Along the intersection of the wall surfaces 12*a* and 12*b*, the respective panels 100*a* and 100*b* have their recessed lips 102*a* and 102*b* in orthogonal contact one with respect to the other. The corner strip 200*a* overlays that intersection of the recessed lips 102*a* and 102*b*. Although the situation of facing recessed lips 102*a* and 102*b* is depicted, panels 100*a* and 100*b* may be oriented such that any of the lips 102, 104, 106 or 108 of one panel may be arranged in orthogonal contact with any lip of the other panel at the wall intersections, and the intersection of walls with ceiling or flooring. Similarly, the corner strips 200*b* and 200*c* overlay the intersection panels 100*a* and 100*b* respective intersection with panels 100*c* which are secured to the structural surface of the ceiling material 16.

Corner strips 200 have a body portion 235 with respective orthogonal surfaces overlaid by a lead layer 230. Lead layer 230 may be formed a single sheet of lead which is angularly formed to overlay the orthogonal surfaces of the body portion 235, or may be two separate strips of lead which are respectively disposed on the orthogonal surfaces of body portion 235. The frontal appearance surface of the corner strip 200 has an arcuate contoured face 202, similar to that of conventional inside corner molding strips, but may have other contours, like that of convention corner round molding, as an example. The particular locations shown for corner strips 200*a*, 200*b* and 200*c* can be interposed, and particularly corner strips 200*b* and 200*c* can be interposed. The corner strip 200*a* extends between the floor and ceiling surfaces while the corner strip 200*c* is formed with an arcuate end portion 203 which is complimentary to the arcuate contoured face 202 of the corner strip 200*a*. Further, the arcuate end portion 204 extends to a notch 206 at the rear end of the respective corner strip in order to provide a tight fit with the corner strip 200*a*. The remaining corner strip 200*b* is positioned to abut the joint between the other two corner strips. The above described arrangement of corner strips is repeated for the intersection of the walls with the flooring surface. In many cases, where the room being protected is located in a basement level of a home, the material of the flooring 10 will be concrete and not covered by panels 100. Where the flooring is other than a concrete slab, then panels 100 may be secured to the floor surface in a mirror image arrangement of the panels covering the ceiling. Thus, the lead layer 230 that is included in the corner strip 200 is thereby combined with the single lead layer disposed in the recessed or overhanging lips 202, 204, 206, 208 at the intersection of the structural surface of the room.

Figure 7:
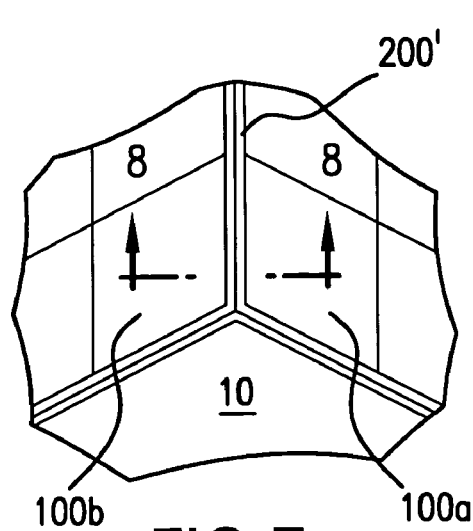
FIG. 7 is a cut-away perspective view of another configuration of the construction system of the present invention.
Figure 8:
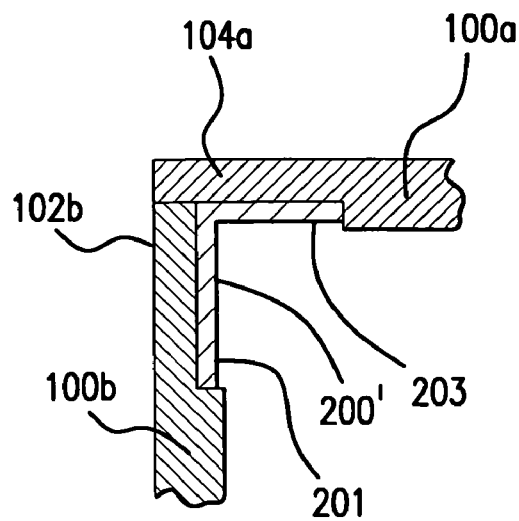
FIG. 8 is a sectional view of the construction system taken along the section line 8—8 of FIG. 7.

Referring now to FIGS. 7 and 8, there is shown the use of corner strips 200' for providing the second lead layer at the intersection of orthogonally disposed panels 100. Corner strip 200' is a angularly shaped member formed of lead and having a pair of orthogonally directed legs 201 and 203. The legs 201 and 203 respectively are disposed in contiguous relationship with the orthogonally disposed recessed lips 102*b* and 104*a*, in the example shown. The two legs 201 and 203 are of different widths, in order to mate with the intersecting lips of the panels 100. It should be understood that the particular recessed lips disposed at the intersection will depend upon whether the intersection is between a pair of walls, a wall and the ceiling or a wall and the floor. Further, rather than recessed lips as shown, the corner strip 200' may be disposed below respective overhanging lips 106, 108. The corner strips 200' are manufactured from the same thickness of lead as utilized in the first and second lead layers 120, 130 of the radiation shielding panels 100, and like the lead layer 230 of corner strips 200, each of the legs 201 and 203 have an adhesive coating 240 on the rear side thereof for bonding to the recessed lips of the panels 100, or the structural surfaces of the room when the overhanging lips of the panels are being positioned over the corner strips 200'.

Figure 9:
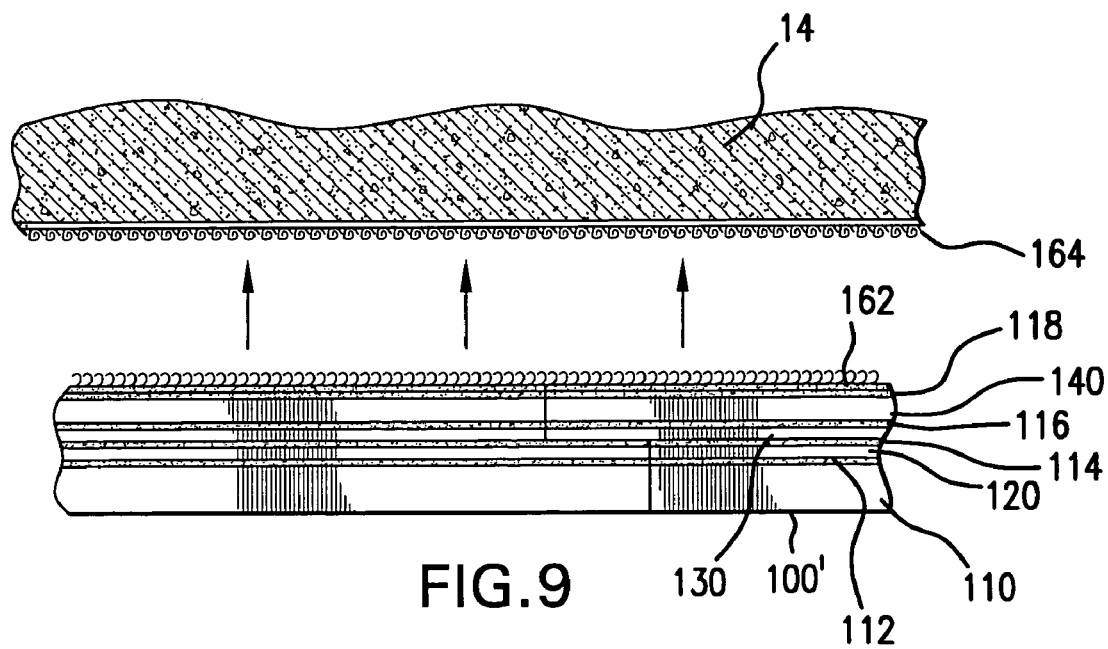
FIG. 9 is a cut-away cross-sectional view showing an alternate mounting arrangement of the present invention.

Referring now to FIG. 9, there is shown radiation shielding panel 100' which provides for an alternate means of mounting the panel to the structural surfaces of a room in a building. Panel 100' includes a front panel 110 bonded to a first lead layer 120 by an adhesive layer 112 exactly as has been previously described with respect to the panel 100 of FIGS. 1 and 2. The first lead layer 120 is bonded to a second layer 130 by an adhesive layer 114, and the second lead layer 130 is bonded to a rear panel 140 by an adhesive layer 116, again exactly as was described for the panel 100 structure shown in FIGS. 1 and 2. Panel 100' however, includes a hook and loop fastening system 160, wherein at least one strip 162 of one part of a hook and loop fastener is bonded to the rear panel 140 by an adhesive layer 118. Tipically, two strips 162 are bonded to the rear panel 140. The panel 100' is mounted to the structural surfaces of a building through the use of one or more strips 164 of the other part of the hook and loop fastener. The second hook and loop fastening strip 164 includes a pressure sensitive adhesive for bonding to the structural surface of the room, such as the masonry wall 14 shown in FIG. 9. The pressure sensitive adhesive of hook and loop fastening strip 164 may also be utilized to bond to other types of structural surfaces, such as drywall, plywood, oriented strand board, and the like, in addition to masonry compositions such as concrete, cinderblock and brick materials. Hook and loop fastening system 160 may be any of a large number of hook and loop fastening systems that are commercially available. One such fastening system which has been successfully utilized for masonry applications is available from Velcro USA Inc., Manchester, N.H. and has the item number designation 90800. That same hook and loop fastening system may be utilized for other than masonry applications, or an industrial strength hook and loop fastener may be utilized for bonding to smooth surfaces, such as those available from Velcro USA Inc., utilizing an adhesive having the designation 19 to provide a pull strength of 8 pounds per inch width.

Utilizing the radiation shielding panels 100, 100', a room of a building can be protected from radiation by mounting the plurality of inter-fitting panels 100, 100' to the structural surfaces of the room, wherein the overhanging lips 106, 108 overlay respective recessed lips 102, 104 of a pair of adjacent panels 100, 100'. Panels 100' are mounted to the structural surfaces of the room by first securing a plurality of strips 164 of one part of the hook and loop fastener to the structural surfaces and then aligning the strips 162 of hook and loop fastener system 160, disposed on the rear side of the panels 100', and then engaging the hook and loop fastener strips 162 and 164 one with the other. Panels 100 are secured to the structural surfaces by removal of the release film 150 for engagement between the adhesive 118 and the structural surface of the building to which the panel is being applied. At the interfaces of orthogonal walls, walls and ceiling and walls and flooring, corner strips 200, 200' are secured thereto to provide the same level of radiation shielding at those interfaces as provided by the body of the inter-fitting panels 100, 100'.

Although this invention has been described in connection with specific forms and embodiments thereof, it will be appreciated that various modifications other than those discussed above, may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A panel for use in assembling a radiation shielded space within a building, said panel comprising a laminated structure of a plurality of layers each having a rectangular contour, at least two of said layers being formed of lead having a thickness of at least 1/64 of an inch and being offset one lead layer with respect to the other lead layer in two directions to define a recessed lip on two adjacent sides of said panel and an overhanging lip on a remaining two adjacent sides of said panel, said two lead layers being joined one to the other by an adhesive layer therebetween.

2. The panel as recited in claim 1, further comprising a rear panel coupled to the other of said lead layers.

3. The panel as recited in claim 2, further comprising an adhesive layer disposed on a rear surface of said rear panel.

4. The panel as recited in claim 2, further comprising one part of a hook and loop fastening layer disposed on a rear surface of said rear panel.

5. The panel as recited in claim 4, wherein said part of said hook and loop fastening layer includes at least two strips of a hook and loop fastener.

6. The panel as recited in claim 1, further comprising a rear most layer formed by an adhesive layer.

7. The panel as recited in claim 1, further comprising a rear most layer formed by one part of a hook and loop fastening layer.

8. The panel as recited in claim 7, wherein said part of said hook and loop fastening layer includes at least two strips of a hook and loop fastener.

9. A construction system for adding radiation shielding to a room, comprising a plurality of inter-fitting panels adapted for mounting to structural surfaces of the room, each of said panels having at least two lead layers joined together by an adhesive layer, one of said lead layers being offset with respect to the other in two directions to form a recessed lip on two adjacent sides of said panel and an overhanging lip on a remaining two adjacent sides of said panel for providing two layers of lead at each joint between adjacent coplanar panels of said plurality of inter-fitting panels.

10. The construction system as recited in claim 9, wherein each of said inter-fitting panels includes a rear most layer formed by a pressure sensitive adhesive layer overlaid by a release layer.

11. The construction system as recited in claim 9, further comprising a plurality of corner strips for overlaying adjacent orthogonally disposed recessed or overhanging lips of a multiplicity of said plurality of inter-fitting panels at an intersection of a pair of structural surfaces of the room, each of said plurality of corner strips having a body portion having an outer decorative surface and a lead layer coupled thereto for overlaying an additional lead layer on the single lead layer of said recessed or overhanging lips to provide two layers of lead at said intersections.

12. The construction system as recited in claim 11, wherein each of said corner strips includes a rear most layer formed by an adhesive layer.

13. The construction system as recited in claim 9, further comprising a plurality of corner strips formed of lead and having two legs in an L-shaped contour, one leg of each corner strip being dimensioned to having a greater width than the other leg thereof to overlay the recessed lips or be overlaid by overhanging lips of adjacent orthogonally disposed panels.

14. The construction system as recited in claim 9, wherein each of said layers of lead have a thickness of at least 1/64 of an inch.

15. A method of adding radiation shielding to a room comprising the steps of:

a. providing a plurality of inter-fitting panels, each of said panels having at least two lead layers joined together by an adhesive layer, one of said lead layers being offset with respect to the other in two directions to form a pair of recessed lips on two adjacent sides of said panel and a pair of overhanging lips on a remaining two adjacent sides of said panel; and, b. mounting said plurality of inter-fitting panels to structural surfaces of the room, said overhanging lips of one panel overlay respective recessed lips of a pair of adjacent coplanar panels for providing two layers of lead at each joint between said panels.

16. The method as recited in claim 15, where the step of mounting is followed by the steps of providing a corner strip formed by at least one lead layer, and adhesively bonding said corner strip to a portion of said plurality of panels disposed at an intersection of a pair of structural surfaces of the room.

17. The method as recited in claim 15, where the step of providing a plurality of inter-fitting panels includes the step of providing each inter-fitting panel with each lead layer having a thickness of at least 1/64 of an inch.

* * * * *